(12) United States Patent
Seshadri et al.

(10) Patent No.: US 9,071,831 B2
(45) Date of Patent: Jun. 30, 2015

(54) METHOD AND SYSTEM FOR NOISE CANCELLATION AND AUDIO ENHANCEMENT BASED ON CAPTURED DEPTH INFORMATION

(75) Inventors: Nambi Seshadri, Irvine, CA (US); Jeyhan Karaoguz, Irvine, CA (US); Chris Boross, Sunnyvale, CA (US); Xuemin Chen, Rancho Santa Fe, CA (US)

(73) Assignee: Broadcom Corporation, Irvine, CA (US)

( * ) Notice: Subject to any disclaimer, the term of this patent is extended or adjusted under 35 U.S.C. 154(b) by 905 days.

(21) Appl. No.: 13/174,370

(22) Filed: Jun. 30, 2011

(65) Prior Publication Data

US 2012/0050582 A1 Mar. 1, 2012

Related U.S. Application Data

(60) Provisional application No. 61/439,209, filed on Feb. 3, 2011, provisional application No. 61/377,867, filed on Aug. 27, 2010.

(51) Int. Cl.
*H04N 5/232* (2006.01)
*H04N 5/217* (2011.01)
*H04N 13/02* (2006.01)
(Continued)

(52) U.S. Cl.
CPC .............. *H04N 13/026* (2013.01); *H04N 5/357* (2013.01); *H04N 5/23229* (2013.01); *H04N 13/0018* (2013.01); *H04N 13/025* (2013.01)

(58) Field of Classification Search
CPC .............. H04N 5/357; H04N 5/23219; H04N 5/23258; H04N 13/0285; H04N 13/026; G10L 17/00

USPC .............. 348/220.1, 222.1, 246, 241, 211.12, 348/345, 207.99
See application file for complete search history.

(56) References Cited

U.S. PATENT DOCUMENTS

| 6,275,258 B1 * | 8/2001 | Chim | 348/211.12 |
| 7,317,872 B1 * | 1/2008 | Posa et al. | 396/57 |
| 7,684,982 B2 * | 3/2010 | Taneda | 704/233 |

(Continued)

OTHER PUBLICATIONS

Zhi Li and Ray Jarvis, "Real time Gesture Recognition using a Range Camera" Monash University, Wellingotn Road Clayton, Victora Australia, pp. 1-7, Dec. 2009.

(Continued)

*Primary Examiner* — Ahmed A Berhan
(74) *Attorney, Agent, or Firm* — Brinks Gilson & Lione

(57) ABSTRACT

A monoscopic camera comprising one or more image sensors and a depth sensor may generate video based on two-dimensional image data captured via the one or more image sensors and corresponding depth information captured via the depth sensor. The camera may process corresponding audio for the generated video based on the captured depth information. The audio processing may comprise mitigating noise in the corresponding audio, enhancing voice quality in the corresponding audio, and/or enhancing audio quality of the corresponding audio. The camera may be operable to determine, based on the captured depth information, one or more sound paths between a source of the corresponding audio and a microphone utilized to capture the corresponding audio emanating from the source. The processing of the audio may comprise removing portions of the captured audio arriving at the microphone via one or more reflection paths.

20 Claims, 8 Drawing Sheets

(51) Int. Cl.
*H04N 5/357* (2011.01)
*H04N 13/00* (2006.01)

(56) References Cited

U.S. PATENT DOCUMENTS

| | | | |
|---|---|---|---|
| 8,949,120 B1* | 2/2015 | Every et al. | 704/226 |
| 2006/0109864 A1 | 5/2006 | Oksman | |
| 2010/0007717 A1* | 1/2010 | Spektor et al. | 348/43 |
| 2010/0302247 A1* | 12/2010 | Perez et al. | 345/440 |

OTHER PUBLICATIONS

C.T.E.R. Hewage, H.A. Karim, S. Worrall, S. Dogon, A.M. Kondoz, Comparison of Stereo Video Coding Support in MPEG-4 MAC< H. 264/AVC and H.264/SVC, University of Surrey, Centre for Communication Systems Research, Guildfor, Surrey, GU2 7XH, U.K., pp. 1-6, Jan. 2007.

* cited by examiner

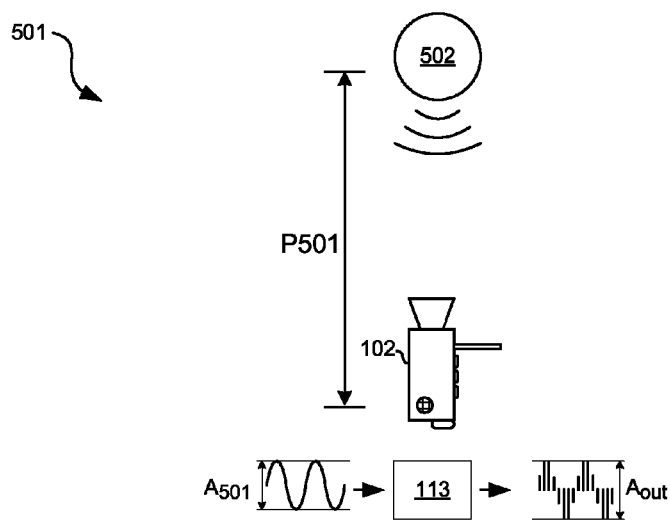
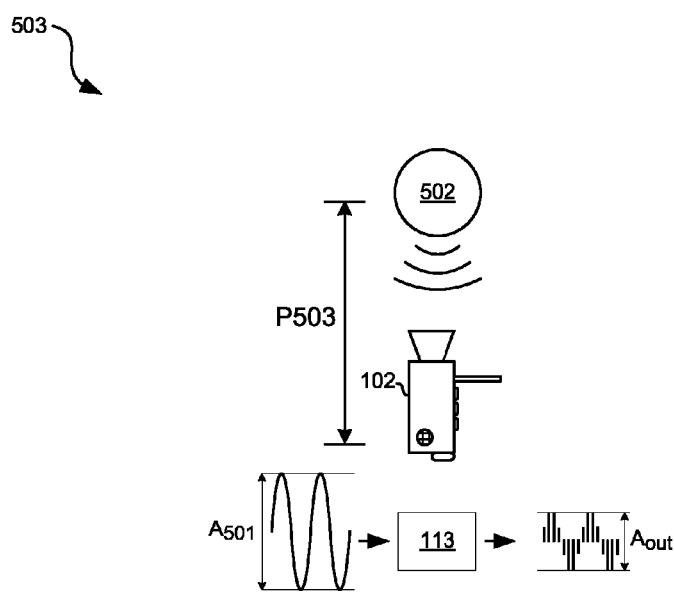
FIG. 5A

METHOD AND SYSTEM FOR NOISE CANCELLATION AND AUDIO ENHANCEMENT BASED ON CAPTURED DEPTH INFORMATION

CLAIM OF PRIORITY

This patent application makes reference to, claims priority to and claims benefit from U.S. Provisional Patent Application Ser. No. 61/439,209 filed on Feb. 3, 2011 and U.S. Provisional Patent Application Ser. No. 61/377,867 filed on Aug. 27, 2010.

Each of the above stated applications is hereby incorporated herein by reference in its entirety.

INCORPORATION BY REFERENCE

This patent application also makes reference to:
U.S. patent application Ser. No. 13/174,344 filed on Jun. 30, 2011;
U.S. patent application Ser. No. 13/174,364 filed on Jun. 30, 2011;
U.S. patent application Ser. No. 13/174,430 filed on Jun. 30, 2011;
U.S. patent application Ser. No. 13/174,261 filed on Jun. 30, 2011;
U.S. patent application Ser. No. 13/077,912 filed on Mar. 31, 2011;
U.S. patent application Ser. No. 13/077,922 filed on Mar. 31, 2011;
U.S. patent application Ser. No. 13/077,886 filed on Mar. 31, 2011;
U.S. patent application Ser. No. 13/077,926 filed on Mar. 31, 2011;
U.S. patent application Ser. No. 13/077,893 filed on Mar. 31, 2011;
U.S. patent application Ser. No. 13/077,923 filed on Mar. 31, 2011;
U.S. patent application Ser. No. 13/077,868 filed on Mar. 31, 2011;
U.S. patent application Ser. No. 13/077,880 filed on Mar. 31, 2011;
U.S. patent application Ser. No. 13/077,899 filed on Mar. 31, 2011;
U.S. Provisional Patent Application Ser. No. 61/439,301 filed on Feb. 3, 2011; and
U.S. patent application Ser. No. 13/077,930 filed on Mar. 31, 2011.

Each of the above stated applications is hereby incorporated herein by reference in its entirety.

FIELD OF THE INVENTION

Certain embodiments of the invention relate to audio processing. More specifically, certain embodiments of the invention relate to a method and system for noise cancellation and audio enhancement based on captured depth information.

BACKGROUND OF THE INVENTION

Support and demand for video systems that support three-dimensional (3-D) video has increased rapidly in recent years. Both literally and physically, 3-D video provides a whole new way to watch video, in home and in theaters. However, 3-D video systems are still in their infancy in many ways and there is much room for improvement in terms of both cost and performance.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for noise cancellation and audio enhancement based on captured depth information, substantially as illustrated by and/or described in connection with at least one of the figures, as set forth more completely in the claims.

These and other advantages, aspects and novel features of the present invention, as well as details of an illustrated embodiment thereof, will be more fully understood from the following description and drawings.

BRIEF DESCRIPTION OF THE DRAWINGS

FIG. 5A is a diagram illustrating control of microphone gain, in accordance with an embodiment of the invention.

DETAILED DESCRIPTION OF THE INVENTION

Certain embodiments of the invention may be found in a method and system for noise cancellation and audio enhancement based on captured depth information. In various embodiments of the invention, a monoscopic camera comprising one or more image sensors and a depth sensor may generate video based on two-dimensional image data captured via the one or more image sensors and corresponding depth information captured via the depth sensor. The monoscopic camera may process corresponding audio for the generated video based on the captured depth information. The audio processing may comprise mitigating noise in the corresponding audio, enhancing voice quality in the corresponding audio, and/or enhancing audio quality of the corresponding audio. The monoscopic camera may be operable to determine, based on the captured depth information, one or more sound paths between a source of the corresponding audio and a microphone utilized to capture the corresponding audio emanating from the source. The one or more sound paths may comprise a direct path and one or more reflection paths. The processing of the audio may comprise removing portions of the captured audio arriving at the microphone via the one or more reflection paths.

The determination of the one or more sound paths may comprise detecting reflective surfaces off of which audio signals from the source may reflect. The determination of the one or more sound paths may comprise determining distances between the source and the detected reflective surfaces, distances between the source and the microphone, and distances between the surfaces and the microphone. The monoscopic camera may be operable to calculate a difference between an amount of time required for sound to travel the direct path and an amount of time required for sound to travel the reflection path. The monoscopic camera may be operable to detect echoes in the audio based on the calculated difference, and remove the detected echoes from the audio. While capturing the audio, a gain of the microphone may be controlled based on the captured depth information. The gain of the microphone may be controlled based on distance between the source and the microphone. As utilized herein a "3-D image" refers to a stereoscopic image, and "3-D video" refers to stereoscopic video.

Figure 1:
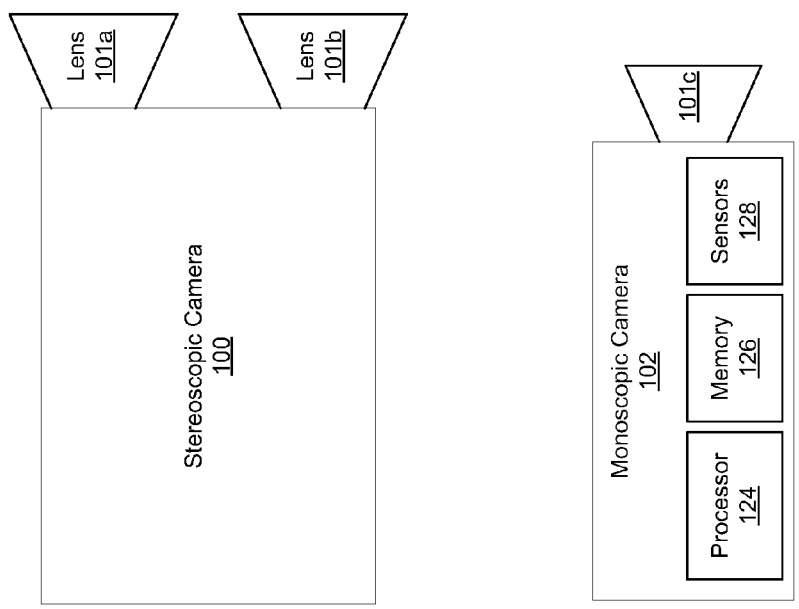
FIG. 1 is a diagram that illustrates an exemplary monoscopic, or single-view, camera embodying aspects of the present invention, compared with a conventional stereoscopic camera.

FIG. 1 compares a monoscopic camera embodying aspects of the present invention with a conventional stereoscopic camera. Referring to FIG. 1, the stereoscopic camera 100 may comprise two lenses 101a and 101b. Each of the lenses 101a and 101b may capture images from a different viewpoint and images captured via the two lenses 101a and 101b may be combined to generate a 3-D image. In this regard, electromagnetic (EM) waves in the visible spectrum may be focused on a first one or more image sensors by the lens 101a (and associated optics) and EM waves in the visible spectrum may be focused on a second one or more image sensors by the lens (and associated optics) 101b.

The monoscopic camera 102 may capture images via a single viewpoint corresponding to the lens 101c. In this regard, EM waves in the visible spectrum may be focused on one or more image sensors by the lens 101c. The image sensor(s) may capture brightness and/or color information. The captured brightness and/or color information may be represented in any suitable color space such as YCrCb color space or RGB color space. The monoscopic camera 102 may also capture depth information via the lens 101c (and associated optics). For example, the monoscopic camera1 102 may comprise an infrared emitter, an infrared sensor, and associated circuitry operable to determine the distance to objects based on reflected infrared waves. Additional details of the monoscopic camera 102 are described below.

The monoscopic camera 102 may comprise a processor 124, a memory 126, and one or more sensors 128. The processor 124 may comprise suitable logic, circuitry, interfaces, and/or code that may be operable to manage operation of various components of the monoscopic camera 102 and perform various computing and processing tasks. A single processor 124 is utilized only for illustration but the invention is not so limited. In an exemplary embodiment of the invention, various portions of the monoscopic camera 102 depicted in FIG. 2 below may correspond to the processor 124. The memory 106 may comprise, for example, DRAM, SRAM, flash memory, a hard drive or other magnetic storage, or any other suitable memory devices. The sensors 128 may comprise one or more image sensors, one or more depth sensors, and one or more microphones. Exemplary sensors are described below with respect to FIG. 2.

Figure 2:
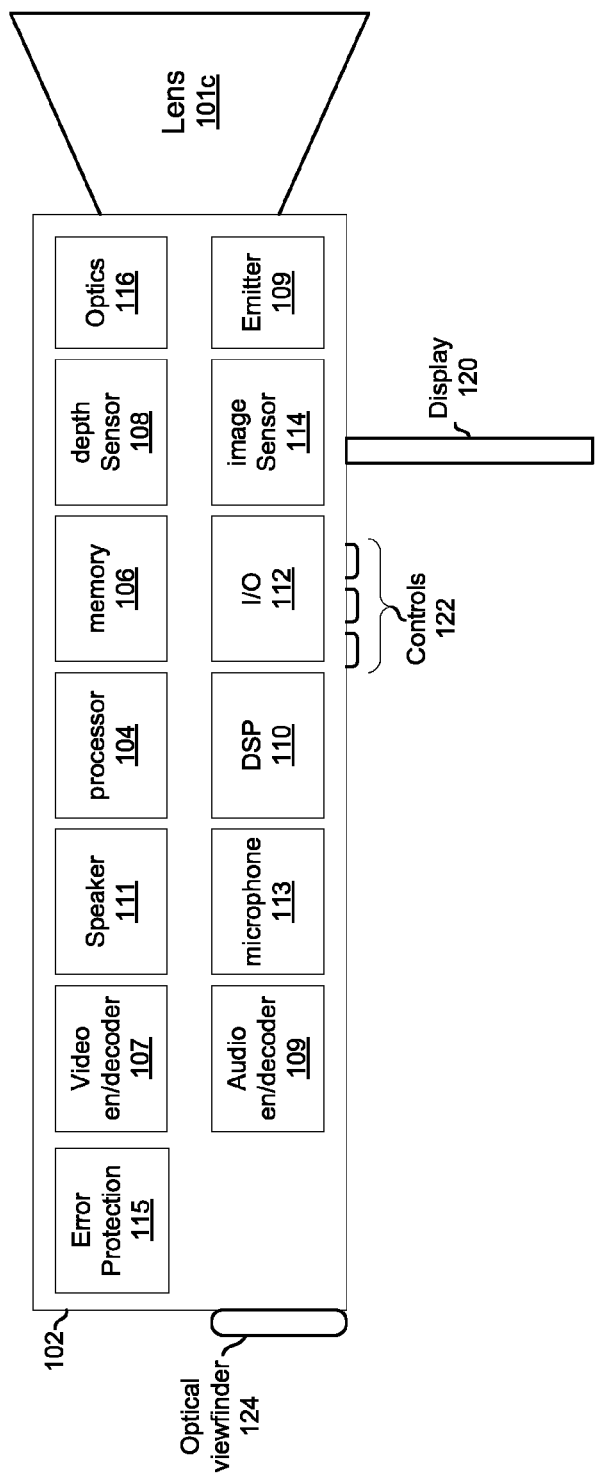
FIG. 2 is a diagram illustrating an exemplary monoscopic camera, in accordance with an embodiment of the invention.

FIG. 2 is a diagram illustrating an exemplary monoscopic camera, in accordance with an embodiment of the invention. Referring to FIG. 2, the monoscopic camera 102 may comprise a processor 104, memory 106, video encoder/decoder 107, depth sensor 108, audio encoder/decoder 109, digital signal processor (DSP) 110, input/output module 112, one or more image sensors 114, optics 116, lens 118, a digital display 120, controls 122, and optical viewfinder 124.

The processor 104 may comprise suitable logic, circuitry, interfaces, and/or code. The processor 104 may be operable to coordinate operation of the various components of the monoscopic camera 102. The processor 104 may, for example, run an operating system of the monoscopic camera 102 and control communication of information and signals between components of the monoscopic camera 102. The processor 104 may execute instructions stored in the memory 106.

The memory 106 may comprise, for example, DRAM, SRAM, flash memory, a hard drive or other magnetic storage, or any other suitable memory devices. For example, SRAM may be utilized to store data utilized and/or generated by the processor 104 and a hard-drive and/or flash memory may be utilized to store recorded image data and depth data.

The video encoder/decoder 107 may comprise suitable logic, circuitry, interfaces, and/or code. The video encoder/decoder 107 may be operable to process captured color, brightness, and/or depth data to make the data suitable for conveyance to, for example, the display 120 and/or to one or more external devices via the I/O block 114. For example, the video encoder/decoder 107 may convert between, for example, raw RGB or YcrCb pixel values and an MPEG encoding. Although depicted as a separate block 107, the video encoder/decoder 107 may be implemented in the DSP 110.

The depth sensor 108 may comprise suitable logic, circuitry, interfaces, and/or code. The depth sensor 108 may be operable to detect EM waves in the infrared spectrum and determine distance to objects based on reflected infrared waves. In an embodiment of the invention, distance may be determined based on time-of-flight of infrared waves transmitted by the emitter 109 and reflected back to the sensor 108. In an embodiment of the invention, depth may be determined based on distortion of a captured grid.

The audio encoder/decoder 109 may comprise suitable logic, circuitry, interfaces, and/or code. The audio encoder/decoder 109 may be operable to process captured audio data to make the data suitable for conveyance to, for example, the speaker 111 and/or to one or more external devices via the I/O block 114. For example, the video encoder/decoder 107 may convert between, for example, raw pulse-code-modulated audio and an MP3 or AAC encoding. Although depicted as a separate block 109, the audio encoder/decoder 109 may be implemented in the DSP 110.

The digital signal processor (DSP) 110 may comprise suitable logic, circuitry, interfaces, and/or code. The DSP 110 may be operable to perform complex processing of captured image data, captured depth data, and captured audio data. The DSP 110 may be operable to, for example, compress and/or decompress the data, encode and/or decode the data, and/or filter the data to remove noise and/or otherwise improve perceived audio and/or video quality for a listener and/or viewer.

The input/output module 112 may comprise suitable logic, circuitry, interfaces, and/or code that may enable the monoscopic camera 102 to interface with other devices in accordance with one or more standards such as USB, PCI-X, IEEE 1394, HDMI, DisplayPort, and/or analog audio and/or analog video standards. For example, the I/O module 112 may be operable to send and receive signals from the controls 122, output video to the display 120, output audio to a speaker 111, handle audio input from the microphone 113, read from and write to cassettes, flash cards, or other external memory attached to the monoscopic camera 102, and/or output audio and/or video via one or more ports such as a IEEE 1394 or USB port.

The microphone 113 may comprise a transducer and associated logic, circuitry, interfaces, and/or code operable to convert acoustic waves into electrical signals. The microphone 113 may be operable to amplify, equalize, and/or otherwise process captured audio signals. The directionality of the microphone 113 may be controlled electronically and/or mechanically. In an embodiment of the invention, the monoscopic camera 102 comprise multiple microphones 113 and may be operable to multiple separate audio tracks corresponding to the multiple microphones and/or may be operable to combine signals from the multiple microphones into a single audio track. The monoscopic camera 102 may also be operable to receive audio signals from or one more remotely located microphones.

The image sensor(s) 114 may each comprise suitable logic, circuitry, interfaces, and/or code that may be operable to convert optical signals to electrical signals. Each image sensor 114 may comprise, for example, a charge coupled device (CCD) images sensor or a complimentary metal oxide semiconductor (CMOS) image sensor. Each image sensor 114 may capture 2D brightness and/or color information.

The error protection module 315 may comprise suitable logic, circuitry, interfaces and/or code that may be operable to perform error protection functions for the monoscopic camera 102. For example, the error protection module 315 may provide error protection to encoded 2D video images and corresponding depth information and/or encoded audio data for transmission to a 3-D video rendering device such as the 3-D video rendering device 204. The error protection module 315 may apply one or more levels of error protections to an encoded 2D video image frame and/or corresponding depth information or data based on one or more of interest within the encoded 2D video image frame.

The optics 116 may comprise various optical devices for conditioning and directing EM waves received via the lens 101c. The optics 116 may direct EM waves in the visible spectrum to the image sensor 114 and direct EM waves in the infrared spectrum to the depth sensor 108. The optics 116 may comprise, for example, one or more lenses, prisms, color filters, and/or mirrors.

The lens 118 may be operable to collect and sufficiently focus electromagnetic waves in the visible and infrared spectra.

The digital display 120 may comprise an LCD, LED, OLED, or other digital display technology on which images recorded via the monoscopic camera 102 may be displayed. In an embodiment of the invention, the digital display 120 may be operable to display 3-D images.

The controls 122 may comprise suitable logic, circuitry, interfaces, and/or code. The controls 122 may enable a user to interact with the monoscopic camera 102. For example, controls for controlling recording and playback. In an embodiment of the invention, the controls 122 may enable a user to select whether the monoscopic camera 102 records and/or outputs video in 2D or 3-D modes.

The optical viewfinder 124 may enable a user to see what the lens 101c "sees," that is, what is "in frame."

In operation, the image sensor(s) 114 may capture frames of 2D video, the depth sensor(s) 108 may currently capture depth information associated with images in the video, and the microphone(s) 113 may concurrently capture audio. During editing and/or playback, the captured depth information may be utilized to generate a 3-D video from the captured 2D video. In this regard, exemplary details of such generation of a 3-D video are described below with respect to FIG. 3

During editing and/or playback, the captured depth information and/or the pixel data of the captured video may be utilized to process the captured audio. As an example, the captured depth information and/or pixel data may be utilized to control gain of the microphone(s) 113, as is described in more detail with respect to FIGS. 5A and 5B below. As another example, the captured pixel data and/or depth information may be utilized to remove echo and/or other noise in the captured audio, as is described in more details with respect to FIGS. 4A-4C below.

Figure 3:
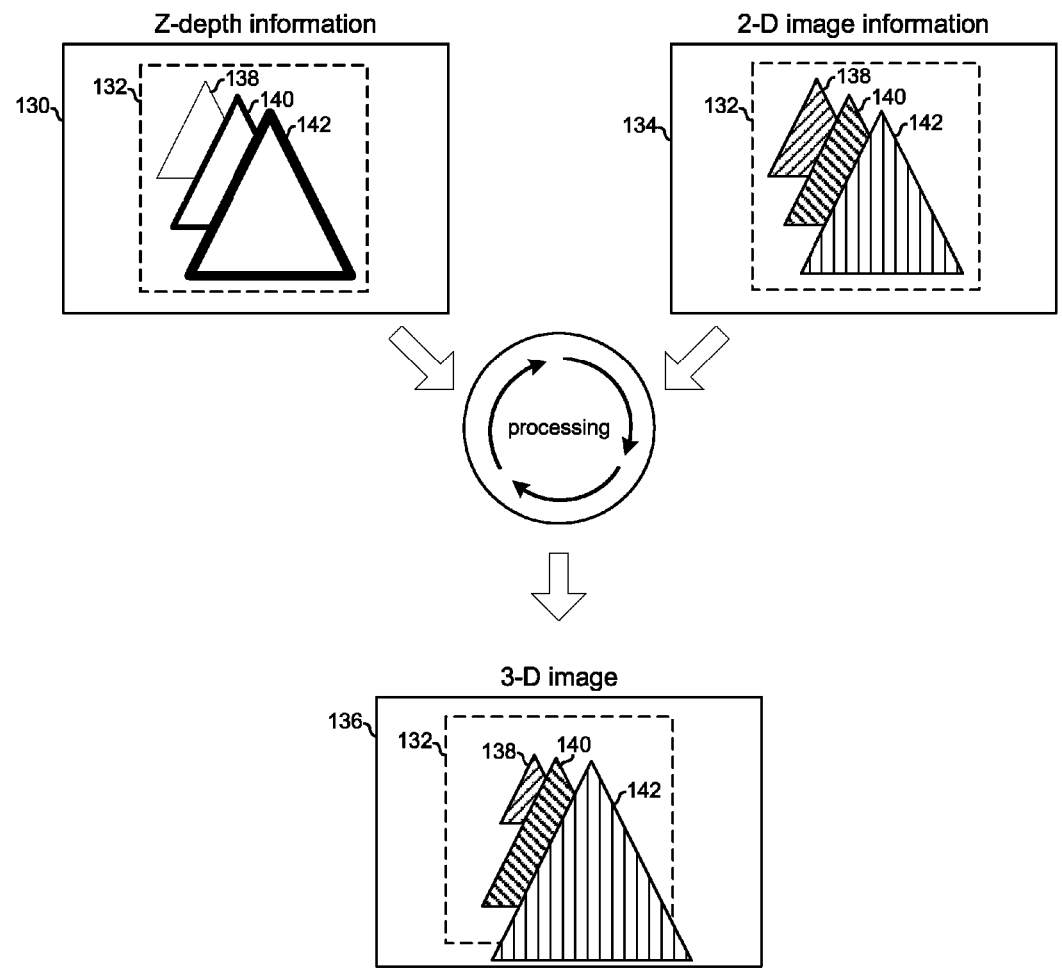
FIG. 3 illustrates processing of depth information and 2D image information to generate a 3-D image, in accordance with an embodiment of the invention.

FIG. 3 illustrates processing of depth information and 2D image information to generate a 3-D image, in accordance with an embodiment of the invention. Referring to FIG. 3 the frame of depth information 130, captured by the depth sensor(s) 108, and the frame of 2D image information 134, captured by the image sensors 114, may be processed to generate a frame 136 of a 3-D image. The plane 132, indicated by a dashed line, is merely for illustration purposes to indicate depth on the two dimensional drawing sheets.

In the frame 130, the line weight is used to indicate depth—heavier lines being closer to the viewer. Thus, the object 138 is farthest from the monoscopic camera 102, the object 142 is closest to the monoscopic camera 102 and the object 104 is at an intermediate distance. In various embodiments of the invention, depth information may be mapped to a grayscale, or pseudo-grayscale, image for display to a viewer. Such mapping may be performed, for example, by the DSP 110.

The image in the frame 134 is a conventional 2D image. A viewer of the frame 134, for example, on the display 120 or on a device connected to the monoscopic camera 102 via the I/O module 112, perceives the same distance between himself and each of the objects 138, 140, and 142. That is, each of the objects 138, 140, and 142 each appear to reside on the plane 132.

The image in the frame 136 is a 3-D image. A viewer of the frame 136, for example, on the display 120 or on a device connected to the monoscopic camera 102 via the I/O module 112, perceives the object 138 being furthest from him the object 142 being closest to him, and the object 140 being at an intermediate distance. In this regard, the object 138 appears to be behind the reference plane, the object 140 appears to be on the reference plane, and the object 142 appears to be in front of the reference plane.

Figure 4A:
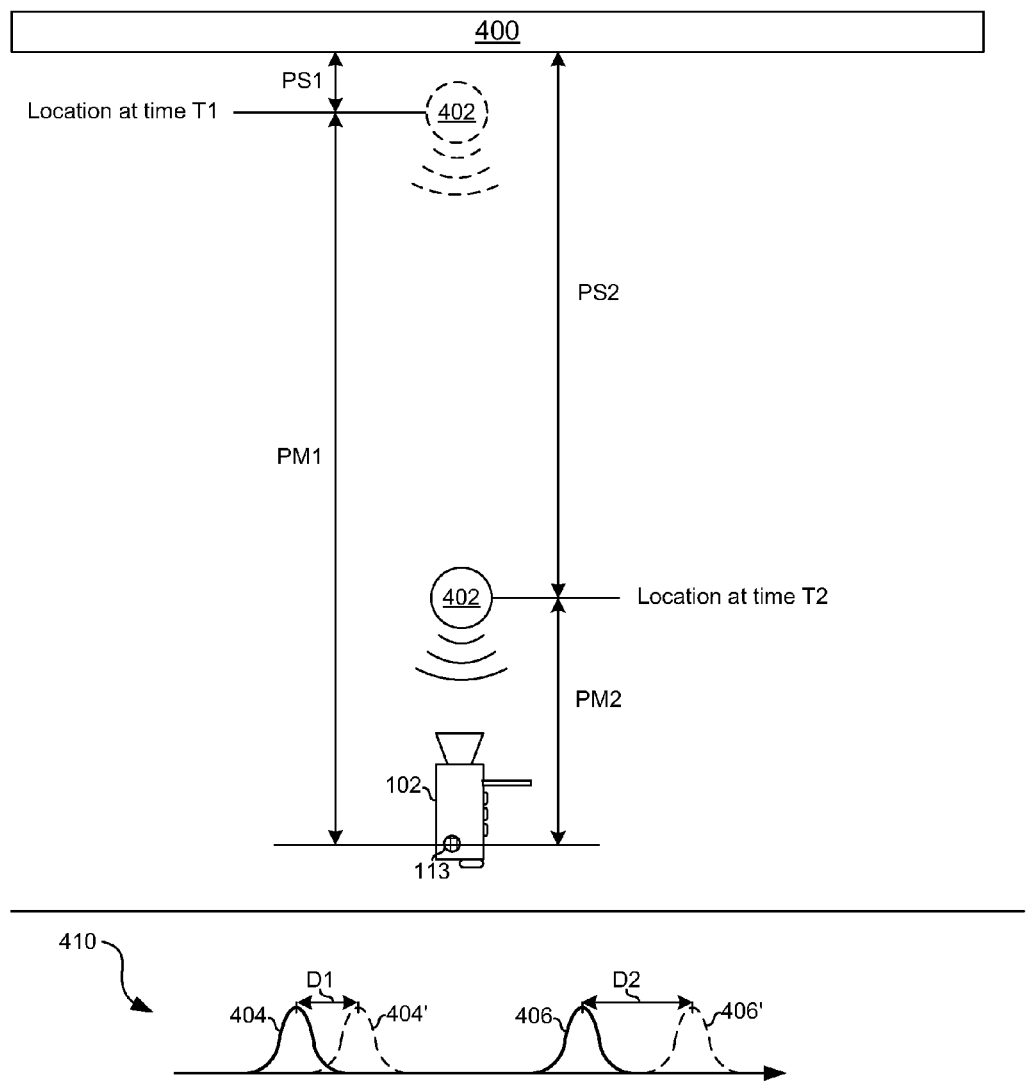
FIG. 4A is a diagram illustrating processing the audio associated with a video scene based on depth information of captured during recording of the scene, in accordance with an embodiment of the invention.

FIG. 4A is a diagram illustrating processing the audio associated with a video scene based on depth information of captured during recording of the scene, in accordance with an embodiment of the invention. Referring to FIG. 4A, from time instant T1 to time instant T2, the monoscopic camera 102 may record a video of a sound source 402 moving away from a reflective surface 400 toward the monoscopic camera 102. At time instant T1, the distance between the sound source 402 and the surface 400 may be DS1 and the distance between the sound source 402 and the microphone 113 may be PM1. Thus, a distance of a direct sound path between the source 402 and the microphone 113 may be approximately PM1 and a distance of a reflection sound path may be approximately 2*PS1+PM1. At time instant T2, the distance between the sound source 402 and the surface 400 may be PS2 and the distance between the sound source 402 and the microphone 113 may be PM2. Thus, a distance of a direct sound path between the source 402 and the microphone 113 may be approximately PM2 and a distance of a reflection sound path may be approximately 2*PS2+PM2.

Also shown is a graph 410 depicting audio signals 404, 404', 406, and 406'. The audio signal 404 may be an audio signal that was generated by the sound source 402 at time instant T1 and arrived at the microphone 113 via the direct path. The audio signal 404' may be the same audio signal generated by the sound source 402 at time instant T1 but may have arrived at the microphone 113 via the reflection path. Thus, the delay, D1, between the signal 404 and the signal 404' may correspond to the difference between the distance of the direct path and the distance of the reflection path. That is, D1 is approximated by 2*PS1*S where S is the speed of sound. The audio signal 406 may be an audio signal that was generated by the sound source 402 at time instant T2 and arrived at the microphone 113 via the direct path. The audio signal 406' may be the same audio signal generated by the sound source 402 at time instant T2 but may have arrived at the microphone 113 via the reflection path. Thus, the delay, D2, between the signal 406 and the signal 406' may correspond to the difference between the distance of the direct path and the distance of the reflection path. That is, D2 is approximated by 2*PS2*S, where S is the speed of sound.

In operation, the monoscopic camera 102 may be operable to, based on the captured video and the captured depth information, detect the sound source 402 and the surface 400 in the video. For example, the sound source 402 may be detected by correlating movements in the image, for example a moving mouth, with the captured audio and the reflective surface 400 may be detected based on static and uniform depth recordings. After detecting the features of the scene, i.e., the source 402 and surface 400, the monoscopic camera 102 may determine the delay between the direct and reflection path and utilize the delay to remove and/or attenuate the signals 404' and 406'. The monoscopic camera 102 may be operable to track the source 402 as it moves and periodically and/or occasionally recalculate the paths and the delay. For example, the paths and delay may be recalculated every X number of video frames, where X is a positive integer.

Echoes may be detected by, for example, buffering received audio signals, generate a delayed version of the buffered signal where the delay is equal to the delay between the direct path and the reflection path, and then comparing the delayed version with the buffered version. Detected echoes may then be attenuated or removed via, for example, one or more filters. The amount of delay introduced to the delayed version of the audio may be updated each time a new delay between direct path and reflection path is calculated.

Although playback and post-processing is described as being performed by the monoscopic camera 102, the invention is not so limited. In this regard, the captured video, depth, and/or audio may be communicated to a device, such as a desktop or laptop computer, for post-processing and/or playback.

Although the surfaces are shown as flat surfaces, the invention is not so limited and surfaces of any type may be detected and accounted for when determining reflection paths.

Figure 4B:
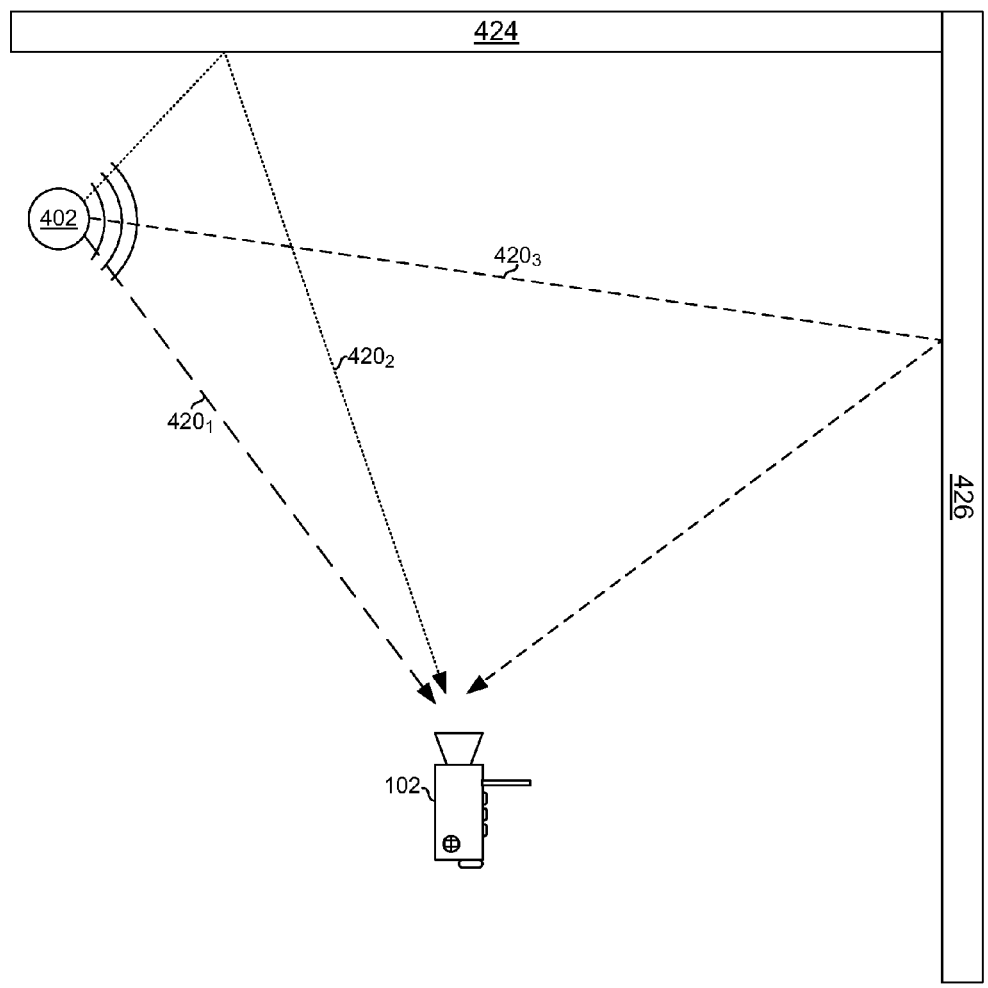
FIG. 4B illustrates another exemplary scenario in which captured depth information may be utilized for processing audio, in accordance with an embodiment of the invention.

FIG. 4B illustrates another exemplary scenario in which captured depth information may be utilized for processing audio, in accordance with an embodiment of the invention. Referring to 4B, the sound source 402 is shown in an environment comprising reflective surfaces 424 and 426. The monoscopic camera 102 may detect the sound source 102 and the reflective surfaces 424 and 426 based on captured image and depth information. The monoscopic camera 102 may then determine the direct path $420_1$ and the reflection paths $420_2$ and $420_3$, calculate the delay between paths $420_1$ and $420_2$ and the delay between $420_1$ and $420_3$, and utilize the calculated delays to remove echoes and/or otherwise enhance the audio.

Figure 4C:
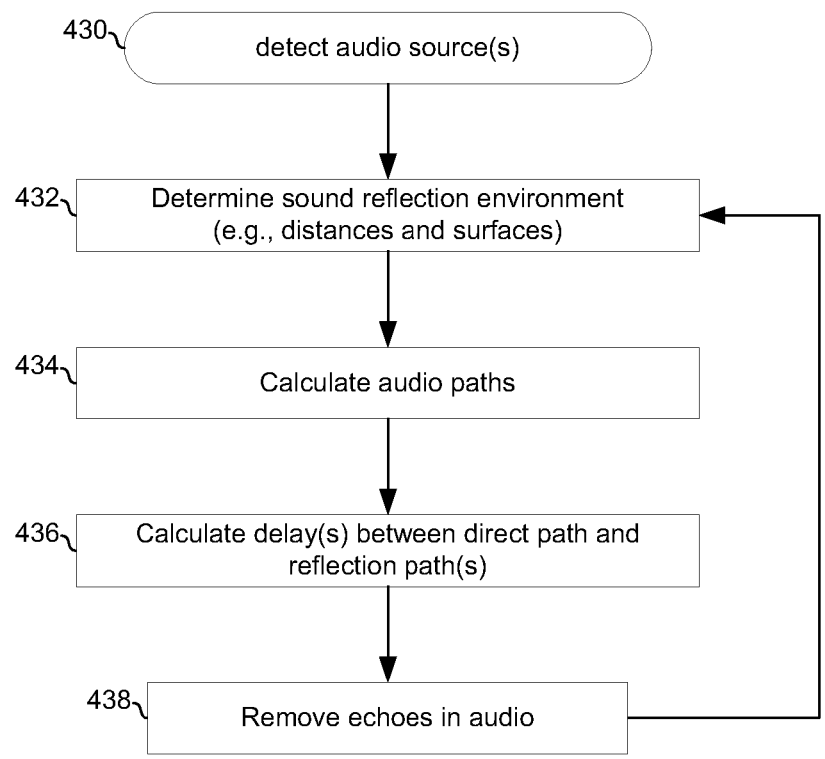
FIG. 4C is a flow chart illustrating exemplary steps for enhancing audio of a scene based on depth information associated with the scene.

FIG. 4C is a flow chart illustrating exemplary steps for enhancing audio of a scene based on depth information associated with the scene. Referring to FIG. 4C, the exemplary steps may begin with step 430 in which the monoscopic camera 102 may process captured video and depth data to detect an audio source appearing in the video. In step 423, the monoscopic camera 432 may determine the sound reflection environment in which the detected sound source is located. This may comprise, for example, determining the distances to and/or between various objects, the size of various objects, and/or the hardness of various objects. In step 434, sound paths between the detected sound source and the microphone 113 may be determined. The sound paths may comprise a direct path between the sound source and the microphone 113 and one or more reflection paths in which the sound is reflected off of one or more of the detected objects. In step 436, the differences in sound propagation time of the direct path and the reflection path(s) may be calculated. In this regard, the time difference between two paths may correspond to the delay between a sound arriving via a shorter of the two paths and the same sound arriving via the longer of the two paths. In step 438, the calculated differences in propagation time may be utilized to remove echoes in audio captured by the microphone 113 of the monoscopic camera 102.

FIG. 5A is a diagram illustrating control of microphone gain, in accordance with an embodiment of the invention. Referring to FIG. 5A, there is shown a scenario 501 in which a sound source 502 is at a distance P501 from the microphone 113 and a scenario 503 in which the sound source 502 is at a distance P503 from the monoscopic camera 102. Since P501 is a larger distance than P503, the audio from the source 501 incident on the microphone 113 is louder in scenario 503 than in scenario 501. In other words, the amplitude, $A_{503}$, is greater than the amplitude $A_{501}$. However, by controlling the gain of the microphone 113 based on the distance to the sound source 502, the amplitude of digital audio output by the microphone 113 to other portions of the monoscopic camera 102 is maintained at or near a desired level, $A_{OUT}$. In this regard, a higher gain is utilized in scenario 501 and a lower gain is utilized in scenario 503 such that the peak amplitude of the digital audio output by the microphone 113 is maintained at $A_{OUT}$. As compared to controlling the gain of the microphone 113 utilizing a feedback look that monitors the amplitude of the digital audio output by the microphone 113, controlling the gain based on captured depth information may enable adjusting the gain of the microphone 113 even when the sound source 502 is not making any sound. For example, the gain can be adjusted after the source 502 has moved but before it starts outputting sound such that gain is properly adjusted from the beginning of the sound without have to wait for a feedback loop to settle.

Figure 5B:
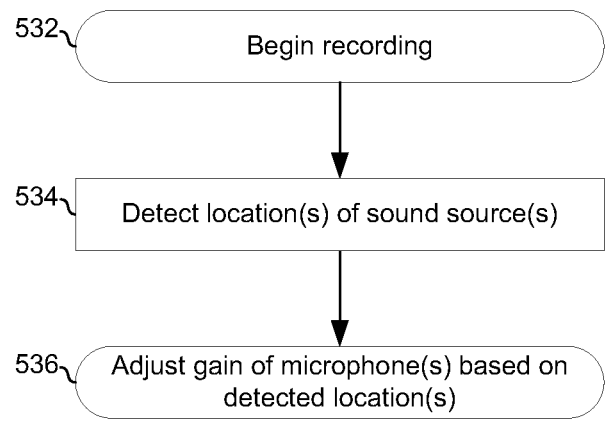
FIG. 5B is a flowchart illustrating exemplary steps for adjusting microphone gain based on captured image and depth information, in accordance with an embodiment of the invention.

FIG. 5B is a flowchart illustrating exemplary steps for adjusting microphone gain based on captured image and depth information, in accordance with an embodiment of the invention. The exemplary steps begin with step 532 when the monoscopic camera 102 begins capturing video, depth information, and audio. In step 534, the monoscopic camera 102 may detect, based on captured pixel data and depth information, a sound source in the image, and determine the location of the detected sound source. In step 536, the gain of the microphone may be adjusted based on the determined location of the sound source.

Various aspects of a method and system for noise cancellation and audio enhancement based on captured depth information are provided. In an exemplary embodiment of the invention, a monoscopic camera 102 comprising one or more image sensors 114 and a depth sensor 108 may generate video based on two-dimensional image data captured via the one or more image sensors 114 and corresponding depth information captured via the depth sensor 108. The monoscopic camera 102 may process corresponding audio for the generated video based on the captured depth information. The audio processing may comprise mitigating noise in the corresponding audio, enhancing voice quality in the corresponding audio, and/or enhancing audio quality of the corresponding audio. The monoscopic camera 102 may be operable to determine, based on the captured depth information, one or more sound paths, such as the paths $420_1$-$420_3$, between a source of the corresponding audio, such as source 402, and a microphone 113 utilized to capture the corresponding audio emanating from the source. The one or more sound paths may comprise a direct path, such as path $420_1$, and one or more reflection paths, such as paths $420_2$ and $420_3$. The processing of the audio may comprise removing portions of the captured audio, such as signals 404' and 406', arriving at the microphone 113 via the one or more reflection paths.

The determination of the one or more sound paths may comprise detecting reflective surfaces, such as surfaces 424 and 426, off of which audio signals from the sound source may reflect. The determination of the one or more sound paths may comprise determining distances between the sound source and the detected reflective surfaces, distances between the sound source and the microphone, and distances between the surfaces and the microphone. The monoscopic camera 102 may be operable to calculate a difference, such as D1, between an amount of time required for sound to travel the direct path and an amount of time required for sound to travel the reflection path. The monoscopic camera 102 may be operable to detect echoes in the audio based on the calculated difference, and remove the detected echoes from the audio. While capturing the audio, a gain of the microphone 113 may be controlled based on the captured depth information. The gain of the microphone 113 may be controlled based on distance between the sound source and the microphone.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for generating three-dimensional video utilizing a monoscopic camera.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method, comprising:
 in a monoscopic camera comprising one or more image sensors and a depth sensor:
  generating video based on two-dimensional image data captured via said one or more image sensors and corresponding depth information captured via said depth sensor;
  receiving audio corresponding to the video and emanating from a source;
  determining, based on said captured depth information, a direct path and one or more reflection paths between the source of said corresponding audio and a microphone utilized to capture said corresponding audio emanating from said source; and
  processing said corresponding audio for said generated video based on said captured depth information.

2. The method according to claim 1, comprising mitigating noise in said corresponding audio based on said captured depth information.

3. The method according to claim 1, comprising enhancing voice quality in said corresponding audio based on said captured depth information.

4. The method according to claim 1, comprising enhancing audio quality in said corresponding audio based on said captured depth information.

5. The method according to claim 1, wherein:
 said processing comprises removing portions of said corresponding audio arriving at said microphone via said one or more reflection paths.

6. The method according to claim 1, wherein said determination of said one or more sound paths comprises detecting reflective surfaces off of which audio signals from said source may reflect.

7. The method according to claim 6, wherein said determination of said one or more sound paths comprises determining distances between:
 said source and said detected reflective surfaces;
 said source and said microphone; and
 said surfaces and said microphone.

8. The method according to claim 1 comprising calculating a difference between an amount of time required for sound to travel a direct path between said source and said microphone and an amount of time required for sound to travel a reflection path between said source and said microphone.

9. The method according to claim 8, comprising:
 detecting echoes in said audio based on said calculated difference; and
 removing said detected echoes from said audio.

10. A system comprising:
 one or more processors and/or circuits for use in a monoscopic camera, said one or more processors and/or circuits comprising one or more image sensors and a depth sensor, said one or more circuits being operable to:

generate video based on two-dimensional image data captured via said one or more image sensors and corresponding depth information captured via said depth sensor;

receive audio corresponding to the video and emanating from a source;

determine, based on said captured depth information, a direct path and one or more reflection paths between a source of said corresponding audio and a microphone utilized to capture said corresponding audio emanating from said source; and process said corresponding audio for said generated video based on said captured depth information.

11. The system according to claim 10, wherein said one or more circuits are operable to mitigate noise in said corresponding audio based on said captured depth information.

12. The system according to claim 10, wherein said one or more circuits are operable to enhance voice quality in said corresponding audio based on said captured depth information.

13. The system according to claim 10, wherein said one or more circuits are operable to enhance audio quality in said corresponding audio based on said captured depth information.

14. The system according to claim 10, wherein:
said one or more sound paths comprise a direct path and one or more reflection paths; and
said processing comprises removing portions of said corresponding audio arriving at said microphone via said one or more reflection paths.

15. The system according to claim 10, wherein said determination of said one or more sound paths comprises detecting reflective surfaces off of which audio signals from said source may reflect.

16. The system according to claim 15, wherein said determination of said one or more sound paths comprises determining distances between:
said source and said detected reflective surfaces;
said source and said microphone; and
said surfaces and said microphone.

17. The system according to claim 10 wherein said one or more circuits are operable to calculate a difference between an amount of time required for sound to travel a direct path between said source and said microphone and an amount of time required for sound to travel a reflection path between said source and said microphone.

18. The system according to claim 17, wherein said one or more circuits are operable to:
detect echoes in said audio based on said calculated difference; and
remove said detected echoes from said audio.

19. The system according to claim 10, wherein said one or more circuits are operable to:
determine a distance to an object in the video; and
process said corresponding audio for said generated video based on said determined distance.

20. A method, comprising:
in a monoscopic camera comprising one or more image sensors and a depth sensor:
generating video based on two-dimensional image data captured via said one or more image sensors and corresponding depth information captured via said depth sensor;
receiving audio corresponding to the video and emanating from a source in the video;
determining a distance from the monoscopic camera to the source based on the depth information;
determining, based on said captured distance to the source, a direct path and one or more reflection paths between the source of said corresponding audio and a microphone utilized to capture said corresponding audio emanating from said source; and
processing said corresponding audio for said generated video based on the depth information.

* * * * *